United States Patent
Aarts et al.

(10) Patent No.: US 6,961,435 B2
(45) Date of Patent: Nov. 1, 2005

(54) INFRA BASS

(75) Inventors: Ronaldus Maria Aarts, Eindhoven (NL); Erik Larsen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 873 days.

(21) Appl. No.: 09/841,958

(22) Filed: Apr. 25, 2001

(65) Prior Publication Data

US 2001/0036285 A1 Nov. 1, 2001

(30) Foreign Application Priority Data

Apr. 27, 2000 (EP) .............................................. 00201509

(51) Int. Cl.⁷ .................................................. H03G 5/00
(52) U.S. Cl. .......................................... 381/98; 381/61
(58) Field of Search .......................... 381/98, 100, 61, 381/123, 1

(56) References Cited

U.S. PATENT DOCUMENTS

| 4,790,014 | A |   | 12/1988 | Watanabe et al. ............... 381/1 |
| 6,285,767 | B1 | * | 9/2001 | Klayman ....................... 381/98 |
| 6,343,130 | B2 | * | 1/2002 | Yamazaki .................... 381/123 |
| 6,381,333 | B1 | * | 4/2002 | Suzuki ......................... 381/98 |

FOREIGN PATENT DOCUMENTS

| EP | 0240286 A2 | 10/1987 | ............ H03G/5/16 |
| JP | 08123421 | 5/1996 | ............ G10H/7/02 |
| WO | WO0014998 | 3/2000 | ............ H04R/3/04 |

* cited by examiner

*Primary Examiner*—Stella Woo
(74) *Attorney, Agent, or Firm*—Edward W. Goodman

(57) ABSTRACT

To improve the aural sensation from an input signal of an audio reproduction system a bandwidth extension device can be used. The bandwidth extension device includes a first and a second signal path and an analyzer for selecting the created signal which fits most for the current input signal.

6 Claims, 3 Drawing Sheets

INFRA BASS

BACKGROUND OF THE INVENTION

1. Field of the Invention

The invention relates to a bandwidth extension device comprising an input for receiving an input signal, filter means for filtering the input signal, creating means for creating an adapted signal with a lower frequency part than the input signal.

The invention further relates to an audio reproduction system comprising such a bandwidth extension device.

2. Description of the Related Art

Such a device is known from European Patent Application No. EP-A-0240286, corresponding to U.S. Pat. No. 4,790,014. To improve the aural sensation in low-pitched (that is: signals in the very low frequency band) sound reproduction by an audio reproduction system or the like, a sub-harmonics generator is used to create this low-pitched signal. In this way, a lower pitch signal is created than is present in the incoming signal.

A disadvantage of the known sub-harmonics generator and the known bandwidth extension device is that the amplitude of the sub-harmonics generator is not linear with the input voltage. Known sub-harmonics generators usually clip the input signal and then divide the signal by two, for example, with a flip-flop, also, for example, a phase-locked loop is used to obtain the sub-harmonics.

SUMMARY OF THE INVENTION

It is an object of the invention to improve such a bandwidth extension device and to obtain such a bandwidth extension device, which is simpler. To this end a first aspect of the invention provides a bandwidth extension system as described above, characterized in that the bandwidth extension device comprises at least a first and a second signal path each having filter means and creating means for creating a first and a second adapted signal, analyze means for comparing the first and second adapted signal with the input signal, and summing and weighting means for selecting the adapted signal which corresponds most with the input signal.
In this way, a bandwidth extension system is obtained which supplies a low-pitched signal part with an amplitude proportional with the original signal.

Further, the created sub-harmonics have no discontinuities as opposed to the sub-harmonics of the prior art bandwidth extension device which have discontinuities.

BRIEF DESCRIPTION OF THE DRAWINGS

The invention and additional features, which may optionally be used to implement the invention to advantage, will be apparent from and elucidated with reference to the examples described below and hereinafter and shown in the figures, in which.

DESCRIPTION OF THE PREFERRED EMBODIMENTS

Figure 1:
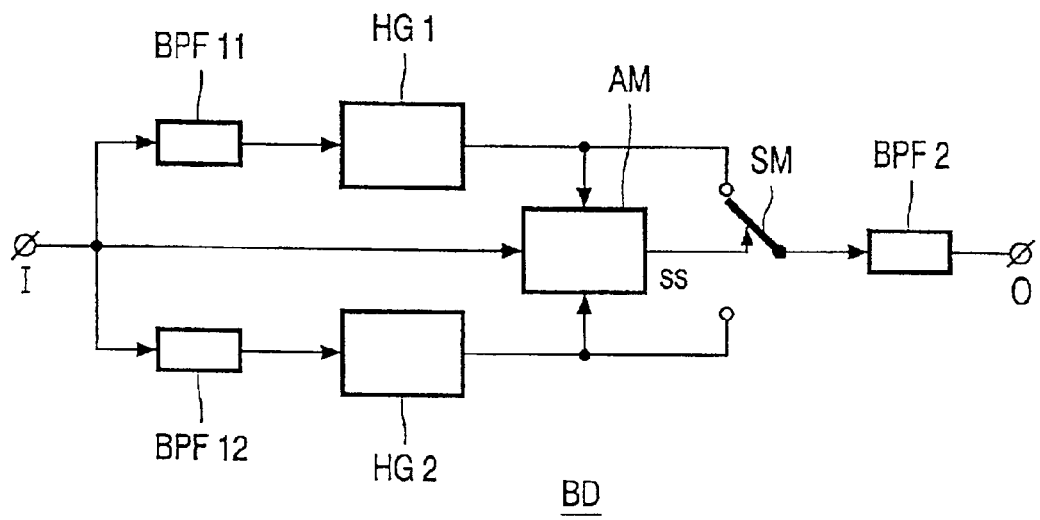
FIG. 1 shows an example of a bandwidth extension device according to the invention.

FIG. 1 shows an example of a bandwidth extension device BD according to the invention. On an input I, the bandwidth extension device receives an input signal, for example, an audio signal. The input I is coupled to a first and a second band-pass filter BPF11 and BPF12, respectively. These band-pass filter form two band-limited parts from the (narrow-band) input signal, for example, one of 300–600 Hz (BPF11) and one of 300–450 Hz (BPF12).

The output of the band-pass filter BPF11 is coupled to a harmonics generator HG1 and the output of the band-pass filter BPF12 is coupled to a harmonics generator HG2.

The two harmonics generators HG1 and HG2 respectively produce two separate streams of harmonics of the selected frequency bands. Frequency components in the first band will be extracted as if the lowest harmonic in the narrow-band signal is the second harmonic, frequency components in the second band will be extracted as if the lowest harmonic in the narrow-band signal is the third harmonic, in this example.

The output of the harmonics generator HG1 is coupled to an input of switching means SM and the output of the harmonics generator HG2 is coupled to the other input of the switching means. The output of the switching means is coupled via a band-pass filter BPF2 to an output O of the bandwidth extension device BD.

It is not necessary that the filtering (BPF2) is equal for both branches, therefore instead of the band-pass filter BPF2 after the switching means, it is also possible to have two separate band-pass filters placed in both branches just before the switch means SM.

Analyze means AM is used to decide which of the two harmonics streams in the frequency domain is the most appropriate one. The analyze means supplies, as decision signal, a signal ss to the switching means SM. The analyze means receives the output signals from both harmonics generators, and further the analyze means receives the input signal from the input I and make a decision on the basis hereof.

Of course, this decision is not valid for the whole excerpt, so this "best fit decision" should be made every so many samples. Two examples of harmonics streams in the frequency domain are given in FIGS. 2 and 3.

It appeared that it is not necessary to choose which of the harmonics generator gives the best results, when dealing with unvoiced speech. For ease in this example, unvoiced speech is treated the same as voiced speech.

To save computing time, FFT can be used, which means that the number of samples within the input signal should be a power of 2.

A possible way to decide whether two signals contain similar information is to take their cross-correlation function. Two signals with similar information are maximally correlated with each other.

The above can be used to select the harmonics stream in the frequency domain, which has the highest correlation with the narrow-band input signal. The harmonics stream consists of a fundamental and its higher harmonics. If the higher harmonics of the narrow-band signal are (roughly) the same as those of one of the harmonics streams, then that stream will most likely contain the right sub-harmonics too. This is in principle only valid for voiced speech.

Figure 2:
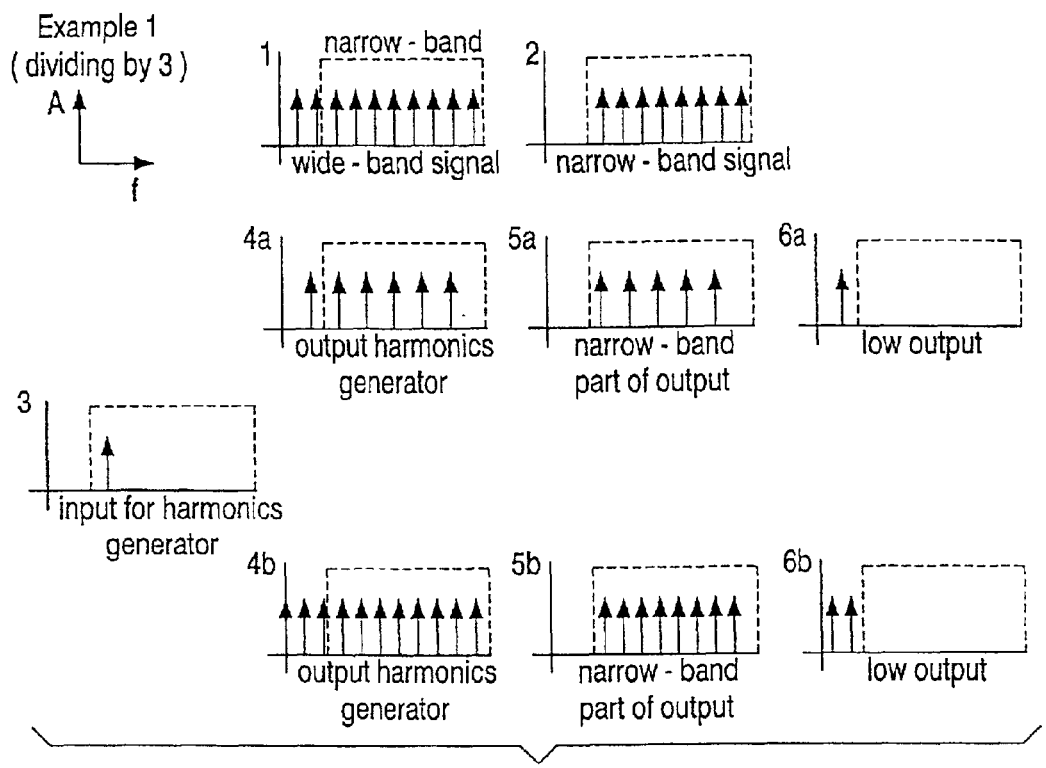
FIG. 2 shows first diagrams of the harmonics streams of a signal in the frequency domain.

FIG. 2 shows an example of the harmonics streams in the frequency domain. A wide-band (1) signal is filtered to obtain a narrow-band signal (2). Of this signal, the first frequency component (3) is taken to generate two streams of harmonics, one as if this component was the second harmonic of the wide-band signal (4a) and one as if it was the third (4b). Comparison of the plot (2) with plots (5a) and (5b) define which stream is most correlated and will most probably contain the right sub-harmonics (6a) and (6b). In this case (6b) fits best.

The whole spectra are used for this decision. All signals in consideration are, therefore, band-limited from 300 to 1200 Hz.

Since the energy of the harmonics streams is not equal, it may be necessary to have some kind of normalization. This can be done by dividing both cross-correlation functions by the square root of the harmonics streams' auto-correlation function of so-called lag zero.

All processing, such as filtering and generating harmonics, introduces delay and phase distortion. Hence, the cross-correlation function does not have to be symmetric around the origin. As a decision value, use is made of the maximum of the cross-correlation function.

Figure 3:
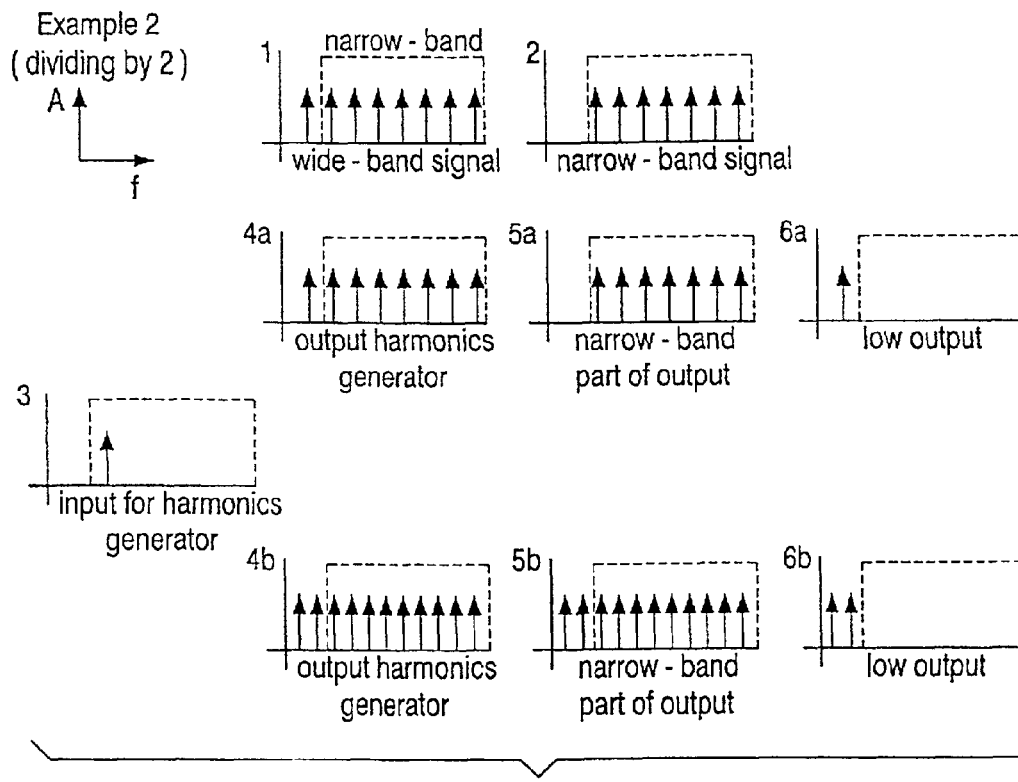
FIG. 3 shows second diagrams of harmonics streams of a signal in the frequency domain.

FIG. 3 shows another example of the harmonics streams in the frequency domain. Also, in this example, the wide-band (1) signal is filtered to a narrow-band signal (2). Also here, of this signal, the first frequency component (3) is taken to generated two streams of harmonics, one as if this component was the second harmonic of the wide-band signal (4a) and one as if it was the third (4b). In this example, stream 6a fits best.

Figure 4:
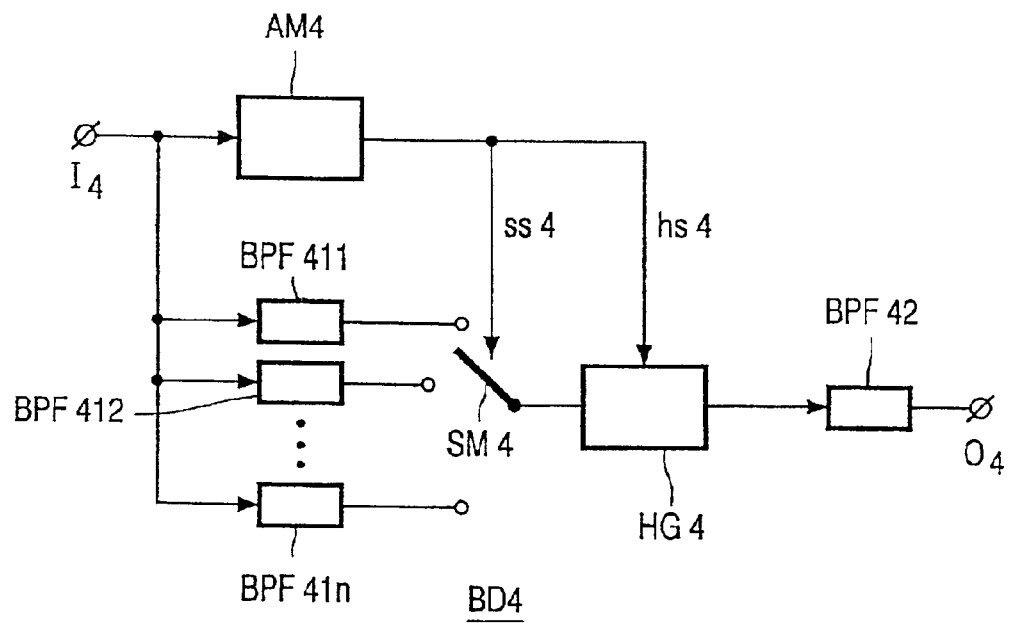
FIG. 4 shows a second example of a bandwidth extension device according to the invention.

FIG. 4 shows a second example of a bandwidth extension system BD4. At the input I4, the bandwidth extension device receives an input signal, for example, an audio signal. This input I4 is coupled to n band-pass filters BPF411 . . . BPF41n. The band-pass filters have, in this example, the following frequency ranges:

BPF411: 300–400 Hz

BPF412: 350–450 Hz . . .

BPF41n: . . . .

The output of each band-pass filter is coupled to an input of switching means SM4. The output of the switching means is coupled to the harmonics generator HG4. The output of the harmonics generator is coupled, via a band-pass filter BPF42, to the output 04 of the bandwidth extension device BD4.

The input I4 is also coupled to analyze means AM4 for analyzing the input signal and supplying a switching signal ss4 to the switching means SM4 and a control signal hs4 to the harmonics generator HG4.

In this way, it is possible to create more opportunities for choosing the part of lower part of the frequency band for which the creation of sub-harmonics fits best by this input signal.

Figure 5:
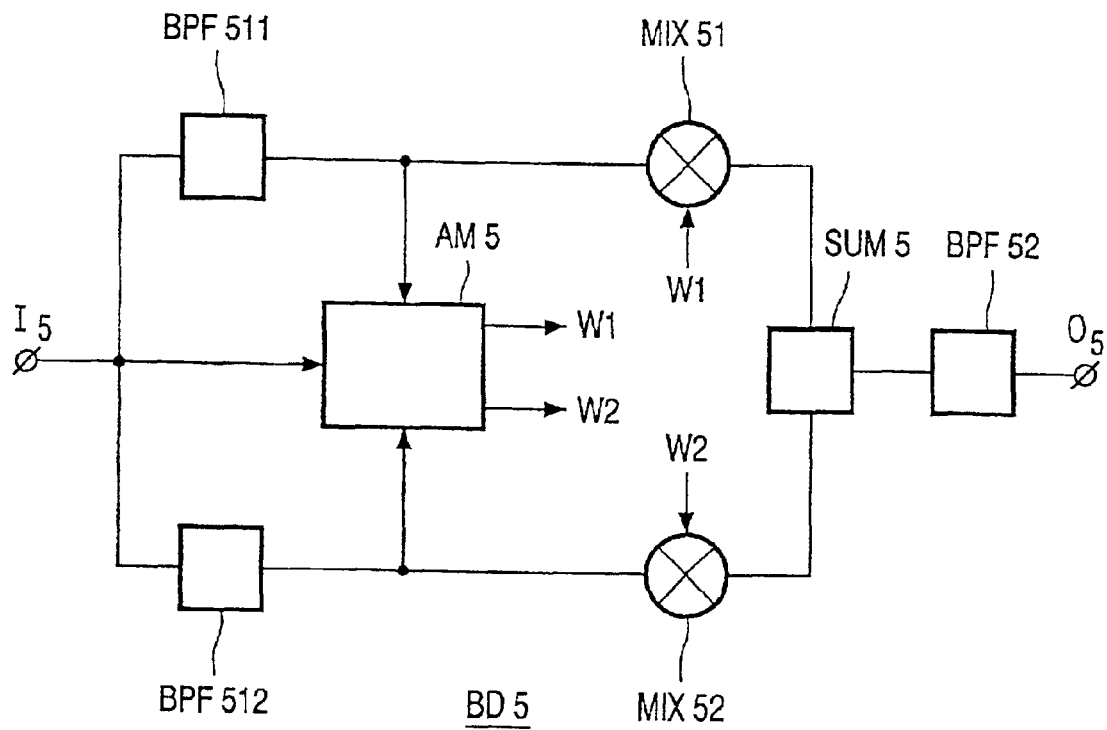
FIG. 5 shows a third example of a bandwidth extension device according to the invention.

FIG. 5 describes a third example of a bandwidth extension device BD5 according to the invention. At the input I5, the bandwidth extension device receives an signal. Also, in this example, two signal paths are available. The first one comprising a band-path filter BPF511 and a mixer MIX51 and a second path comprising a band-pass filter BPF512 and a mixer MIX512.

In this example, the analyze means AM5 also receives the input signal and the signals after the band-pass filters. Here, the analyze means supplies a first control signal w1 and a second control signal w2. These control signals are supplied to the respective mixers MIX51 and MIX52. The outputs of the mixers are coupled to a summing device SUM5 for summing the two weighted signals and supplying, via the band-pass filter BPF52, the summed weighted signals to the output O5 of the bandwidth extension device BD5.

Figure 6:
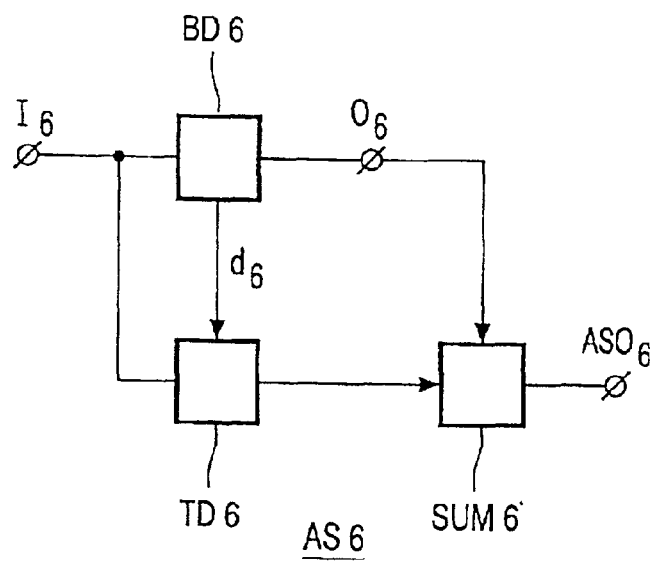
FIG. 6 shows an example of an audio reproduction system according to the invention.

FIG. 6 shows an example of an audio reproduction system AS6 comprising a bandwidth extension device BD6 according to the invention. The audio reproduction system further comprises an input I6 for receiving an input signal. The input is coupled to a time delay device TD6 for compensating for the delay of the bandwidth extension device, the bandwidth extension device supplies, in this example, a control signal d6 to the time delay device. The output of the time delay device and the output of the bandwidth extension device are coupled to a summing device SUM6 for summing the (delayed) original signal and the bandwidth extended low frequency signal, at the output ASO6 of the audio reproduction system AS6.

It should be noted that above the invention has been described on the basis of some examples.

The man skilled in the art is well aware of alternatives within the scope of the invention.

For example, it is also possible to send information about the optimal filtering together with the signal to the "receiver". This is known in the art "non-blind" versus "blind" as described before. In that case, the analyze means only has to decode the information about which filer is optimal for this signal and supply, for example, the control signals w1 and w2 (see FIG. 5) to the mixers.

Further, instead of using the time domain, the invention can also be used in the frequency domain using the inverse Fourier Transform (H H*9ejw)).

Above are examples described (see FIGS. 2 and 3) with divide factors 2 and 3. Of course, also higher factors can be used.

What is claimed is:

1. A bandwidth extension device comprising:

an input for receiving an input signal;

at least a first signal path and a second signal path coupled to the input, each of said first and second signal paths having filter means for filtering the input signal and creating means for creating an adapted signal with a lower frequency part than the input signal, said first and second signal paths supplying a first and a second adapted signal;

analyze means for comparing the first and second adapted signal with the input signal; and means for selecting the first or the second adapted signal corresponding most with the input signal.

2. The bandwidth extension device as claimed in claim 1, characterized in that the selecting means comprises switching means for switching between a first and a second signal path.

3. The bandwidth extension device as claimed in claim 1, characterized in that the analyze means controls each of the creating means.

4. The bandwidth extension device as claimed in claim 1, characterized in that the selecting means comprises mixers.

5. An audio reproduction system comprising a bandwidth extension device as claimed in claim 1.

6. The audio reproduction system as claimed in claim 5, characterized in that the audio reproduction system comprises time delay means to compensate for any delay in the bandwidth extension device.

* * * * *